(12) United States Patent
Newman

(10) Patent No.: US 7,251,740 B2
(45) Date of Patent: Jul. 31, 2007

(54) APPARATUS COUPLING TWO CIRCUITS HAVING DIFFERENT SUPPLY VOLTAGE SOURCES

(75) Inventor: Paul F. Newman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 427 days.

(21) Appl. No.: 10/764,406

(22) Filed: Jan. 23, 2004

(65) Prior Publication Data

US 2005/0162188 A1    Jul. 28, 2005

(51) Int. Cl.
*G06F 1/12* (2006.01)
*G06F 13/42* (2006.01)
*H04L 5/00* (2006.01)
*H04L 7/00* (2006.01)

(52) U.S. Cl. .................. 713/401; 713/400; 326/62; 326/80; 326/81; 327/333

(58) Field of Classification Search .............. 326/62, 326/80, 81; 327/333; 713/400–601
See application file for complete search history.

(56) References Cited

U.S. PATENT DOCUMENTS

| 5,946,470 | A | * | 8/1999 | Neal et al. ................. 703/21 |
| 6,104,219 | A | * | 8/2000 | Barkatullah et al. ........ 327/116 |
| 6,351,173 | B1 | * | 2/2002 | Ovens et al. ............... 327/333 |
| 6,693,457 | B2 | * | 2/2004 | Yepp ........................ 326/63 |
| 6,708,261 | B1 | * | 3/2004 | Shin et al. ................. 711/167 |
| 6,806,734 | B2 | * | 10/2004 | Cairns et al. ............... 326/68 |
| 6,829,715 | B2 | * | 12/2004 | Chiao et al. ............... 713/401 |

OTHER PUBLICATIONS

Author Unknown, "Flip-flop (electronics)" from website Wikipedia, http://en.wikipedia.org/wiki/Flip-flop_%28electronics%29, 8 pages.*

* cited by examiner

*Primary Examiner*—Rehana Perveen
*Assistant Examiner*—James F. Sugent
(74) *Attorney, Agent, or Firm*—Schwabe, Williamson & Wyatt, P.C.

(57) ABSTRACT

An apparatus for coupling two circuits having different supply voltages is described herein.

18 Claims, 4 Drawing Sheets

APPARATUS COUPLING TWO CIRCUITS HAVING DIFFERENT SUPPLY VOLTAGE SOURCES

BACKGROUND OF THE INVENTION

1. Field of the Invention

The present invention relates to electronic devices, and in particular, to circuits relating to different supply voltage levels.

2. Description of Related Art

With microprocessor designs, there often is a need to use separate power supplies for microprocessor input-output (I/O) circuits and microprocessor core circuits. In a microprocessor system power and thermal management techniques for the core require changing the power supply voltages during use. While core clock frequencies are scaled back when supply voltage is reduced to save power, the I/O circuitry operates at a fixed system clock frequency. It is difficult to meet system timing requirements if the I/O supply has to function at the lowest values supported by the core supply. Also, the microprocessor's I/O circuitry interfaces over one or more buses with other devices which may have I/O modules fabricated using older manufacturing processes. Hence, such I/O modules do not function well at the lowest supply settings for the microprocessor core.

Having separate power supplies for the core and I/O sections of the microprocessor requires the use of level shifters. Level shifters propagate signals between supply domains while maintaining full rail swings between supply and ground. Without full-rail output swings, a signal would be more sensitive to noise and a following stage logic gate could dissipate large amounts of power by passing DC current between supply and ground. Level shifters are used to address this issue. While level shifters have the desirable attribute of rail-to-rail output swings, they exhibit longer gate delays than standard CMOS logic and are prone to significant delay variation due to changes in process, temperature, and the two supply voltages.

In source-synchronous system interfaces between microprocessors and buses connected to other devices, it is necessary in the microprocessor to use level shifters for transitioning on-chip signals between different supply voltage domains (also simply referred to as supply domains) for the core and I/O circuits. Hence, this provides one example of where level shifters introduce extra timing skew, in this case between the rising and falling edges or transitions of the data signals and strobes (forwarded clock signals). For a source-synchronous bus, an important metric is the relative timing between data and strobe edges (signal transitions). When subject to variations, the data and strobe transitioning in the same direction track each other well. The worst case timing skew occurs when data and strobe are transitioning in opposite directions.

Referring to FIG. 1, there is illustrated a prior art converter circuit, which includes a single level shifter 10 in the data path extending between a core supply domain 12 and a I/O supply domain 14. The two domains 12 and 14 are separated by a dashed line 16. A master latch 18 and slave latch 20 receives a Data1 signal which, in response to a clock signal, is provided to the level shifter 10 as a Data2 signal. The level shifter 10 produces a Level Shifted Data signal as an output. With this topology, the variation in the timing of a single edge may be significant, but the difference in the timing of rising and falling signals shows even more variation.

Referring to FIG. 2, the Clock, Data2 and Level Shifted Data signals are shown for the converter circuit of FIG. 1. The Data2 signal, relative to the rising edge of the Clock signal, is delayed based upon the delay introduced by the master and slave latches 18 and 20. Thereafter, the Level Shifted Data signal is further delayed by the level shifter 10, but more importantly, the cross hatching in the Level Shifted Data signal represents the miss-match in rise and fall delays of the rising and falling edges of the Level Shifted Data signal. This timing skew is sometimes referred to as Tco skew.

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 3:
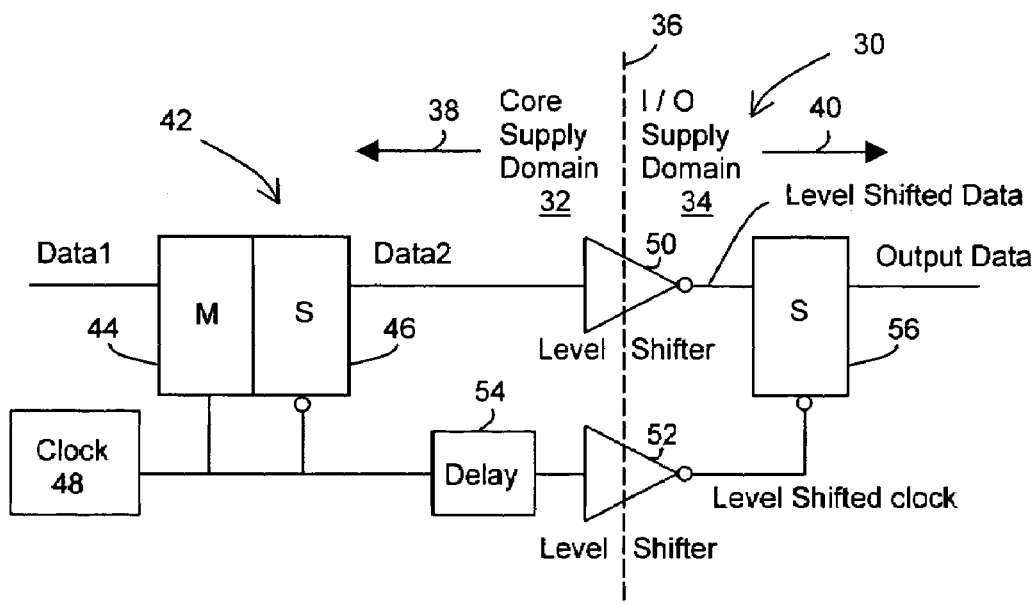
FIG. 3 is a schematic diagram of a converter circuit for extending a data path between two supply domains in accordance to one embodiment of the present invention.

Referring to FIG. 3, there is disclosed a converter circuit 30 for extending a data path between a first supply domain 32 and a second supply domain 34, with the division of the two domains 32 and 34 being shown by a dashed line 36 and opposed arrows 38 and 40. The two supply domains 32 and 34 are coupled to two different power supply sources (not shown) which may have different supply voltages. In this illustrative example, the first supply domain 32 may be in a core section of a microprocessor and the second supply domain may be in an input-output (I/O) section of the microprocessor. The core section includes a central processing unit (CPU). The converter circuit 30 may also be reversed to receive signals in the I/O supply domain 34 and transport them to the core supply domain 32. In this case, the converter circuit 30 becomes the mirror image of the converter circuit shown in FIG. 3.

The converter circuit 30 may include a flip-flop 42 having a master latch 44 and an upstream slave latch 46, which has a Data1 signal as an input and a Data2 signal as an output. A clock source 48 may provide a clock signal to the master latch 44 and the slave latch 46. The converter circuit 30 includes a first and a second level shifter 50 and 52. The first level shifter 50 may have an input coupled to the output of the upstream slave latch 46 to receive the Data2 signal and generates at its output a Level Shifted Data signal. The second level shifter 52 may have an input coupled to the output of a delay element 54, which in turn has an input coupled to the clock source 48. Hence, the delay element 54 receives the clock signal and introduces a predetermined delay into the Clock signal to create a delayed Clock signal, which is received by the second level shifter 52. The delay element 54 may include a plurality of inverters. The second level shifter 52 generates a Level Shifted Clock signal at its output. The Level Shifted Clock signal has a plurality of clock cycles, with each of the clock cycles having a rising clock edge and a falling clock edge. A downstream slave latch 56 may have a pair of inputs coupled to outputs of the first and second level shifters 50 and 52 to receive the Level Shifted Data signal and the Level Shifted Clock signal, respectively. In response to the Level Shifted Data and Level Shifted Clock signals, the downstream latch 56 generates an Output Data signal. Although the level shifters 50 and 52 are shown as having an inverter function, this inverter function is unnecessary, in that the remaining I/O circuitry provides other opportunities to provide the desired number of even numbers of inverters.

Figure 1:
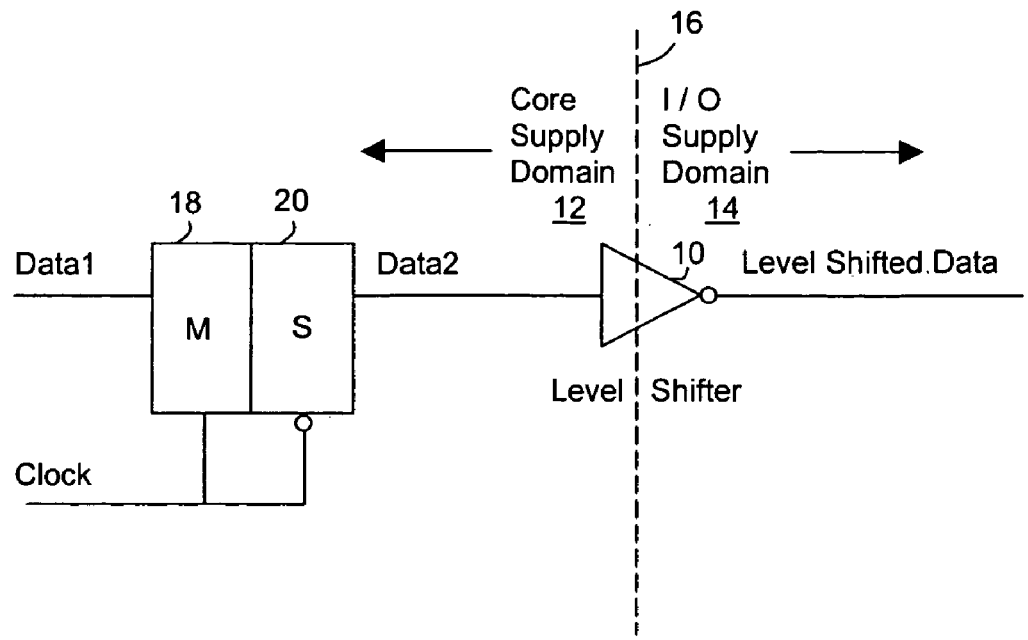
FIG. 1 is a schematic diagram of prior art converter circuit for extending a data path between two supply domains.
Figure 2:
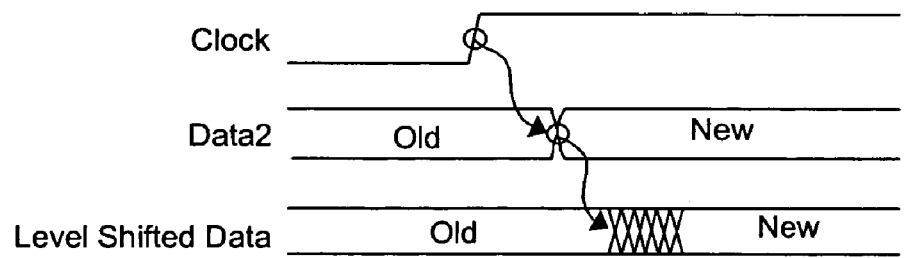
FIG. 2 is a timing diagram for the converter circuit of FIG. 1.
Figure 4:
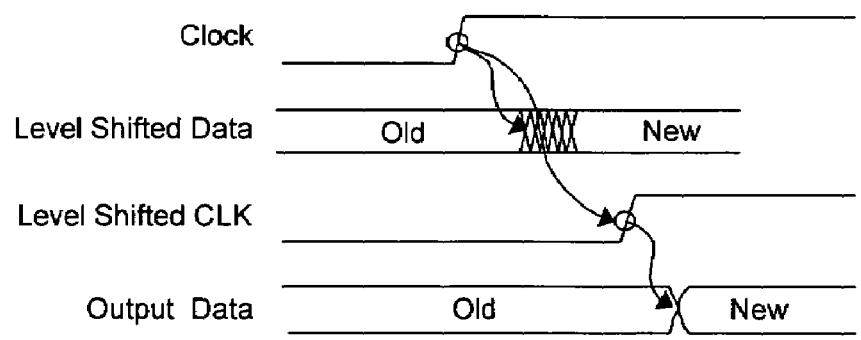
FIG. 4 is a timing diagram for the converter circuit of FIG. 3.

FIG. 4 shows a timing diagram of the Clock, Level Shifted Data, Level Shifted Clock, and Output signals for the converter circuit 30 of FIG. 3. Referring to FIGS. 3 and 4, the operation of the converter circuit 30 will now be described. With respect to the master-slave flip-flop 42, the master and slave latches 44 and 46 each have an open and a close state. The latches 44 and 46 pass through the data when in the open (transparent) state and hold (latch) the data when in the close state. When the master latch 42 is in its close state, it is holding the Data1 signal acquired from the previous clock phase. At the same time, the slave latch 46 is in the open state and is passing the Data1 signal held by the master latch 42 through to the flip-flop's output as the Data2 signal. When the clock phase is reversed, the master latch 44 switches to its open state to acquire new Data1 signal and at the same time the slave latch 46 switches to its close state of holding the previous-provided Data1 signal and continuing to provide it at the output of the flip-flop 42 as the Data2 signal. Hence, the master and slave latches operate "out-of-phase". The rising clock edge of the clock signal shown in FIG. 4 may be used to reset the master latch 44 to its open state and the falling clock edge of the clock signal may be used to reset the slave latch 46 to its open state. Generally, the flip-flop 42 may introduce a one clock cycle delay in the Data1 signal to generate the Data2 signal. Although this delay is not shown in FIG. 4, it is shown in the Data2 signal of FIG. 2.

The first level shifter 30 generates at its output a Level Shifted Data signal shown in FIG. 4. The rising and falling data edges of the data transitions of the Level Shifted Data signal are mismatched due to Tco skew caused by the first level shifter 34, as shown by cross hatching. The cross hatching shows where a plurality of rising and falling data edges occur over a plurality of clock cycles. More specifically, the delays in the rise and fall times of the data transitions differ, with either one possibly being longer relative to the other, depending upon the particular level shifter and the particular values of the voltage supply settings. It should be noted that this period of mismatching is generated by both the falling and rising data edges and is not generated by just the falling data edges or just the rising data edges. The period of mismatch of all rising data edges or all falling data edges would likely be considerably shorter in duration. Consequently, the signal variation caused one clock edge of the delayed Clock signal going through the second level shifter 52 is smaller than the variation caused by both the rising and falling data edges of the Data2 signal going through the first level shifter 50 or the rising and falling clock edges of the delayed Clock signal going through the second level shifter 52.

The downstream slave latch 56 passes through the Level Shifted Data signal when in its open (transparent) state and holds (latches) the previously-provided Level Shifted Data signal when in its close state. The Clock signal from the clock source 48 is first delayed by the delay element 54 and then further delayed by the second level shifter 52, so as to generate the Level Shifted Clock signal of FIG. 4. Only a single triggering clock edge of Level Shifted clock signal is used for clocking the downstream slave latch 56. Although this triggering clock edge may be either the rising clock edge or falling clock edge, in the illustrative example it is arbitrarily selected to be the falling clock edge of the Level Shifted Clock signal. Hence, there is less skewing (signal variation) of the Level Shifted Clock signal, utilizing only one clock edge, than the Level Shifted Data signal, having both rising and falling data edges. More specifically, the falling edges of the Level Shifted Data signal and the Level Shifted Clock signal substantially match except for variations caused by noise. The largest mismatch will be the falling clock edge of the Level Shifted Clock signal and the rising data edge of the Level Shifted Data signal.

The delays caused by the falling clock edges of the delayed Clock signal passing through the second level shifter 52 should be similar to the delays caused by the falling data edges of the Data2 signal passing through the first level shifter 50. The added delay of the delay element 54 may be set to insure that the downstream slave latch 56 does not become transparent (open state) and pass the Level Shifted Data signal until after the period of mismatch shown in the Level Shifted Data signal. In other words, the downstream slave latch 56 remains non-transparent (close state) until after the rising and falling data edges of the Level Shifted Data signal from the first level shifter 50 have arrived and been set up at the downstream slave latch 56 so that the period of mismatch has passed. Then, after the period of mismatch, a single clock edge of the Level Shifted Clock signal is used to trigger the downstream slave latch 56 to transition from its close state to its open state. When in its open state, the downstream slave latch 56 passes on the Level Shifted Data signal so as to generate an Output Data signal shown in FIG. 4. Another way to characterize this delay is that the downstream slave latch 56 is waiting for the slowest of the rising and falling data edges to arrive before transitioning to its open or transparent state.

After the triggering by the falling clock edge of the Level Shifted Clock signal, the subsequent rising clock edge of the Level Shifted Clock signal switches the downstream slave latch 56 to its close state so as to hold the current Output Data signal until the next falling clock edge of the Level Shifted Clock signal. Therefore, the rising clock edges do not affect the signal transitions of the Output Data signal. It is the single clock edge (in this illustrative case, the falling clock edge) of the Level Shifted Clock signal that determines the timing of the signal transitions of the Output Data signal. More specifically, the timing of the output delay of the Output Data signal is affected by only one clock edge of the Clock signal, which passes through the delay element 54 and the level shifter 52, to become the Level Shifted Clock signal that enables the downstream slave latch 56.

Referring to FIGS. 3 and 4, in summary the timing of the transitions of the Output Data signal is associated with one clock edge, the triggering clock edge, of the Level Shifted Clock signal. Moving the delay element 54 and the second level shifter 52 into the clock path constrains the timing of the Output Data signal to be determined by this clock edge. The timing sequence is designed so the Level Shifted Data signal arrives at the downstream slave latch 56 before the latch 56 enters its open (transparent) state. To accomplish this, the delay element 54 may introduce a predetermined delay just long enough to make sure that the mismatched falling and rising data edges have passed, i.e., have already arrived at the downstream slave latch 56. The duration of the predetermined delay may exceed the duration of the time period during which the mismatching occurs. As a result, the Output Data signal only experiences the variability of that one edge and not both edges. This timing eliminates rise/fall delay matching as an issue in the first level shifter 50. In various embodiments, as appropriate tradeoffs for some applications, the delay of the delay element 54 may nevertheless be longer than the minimum required to bypass the period of mismatch.

Figure 5:
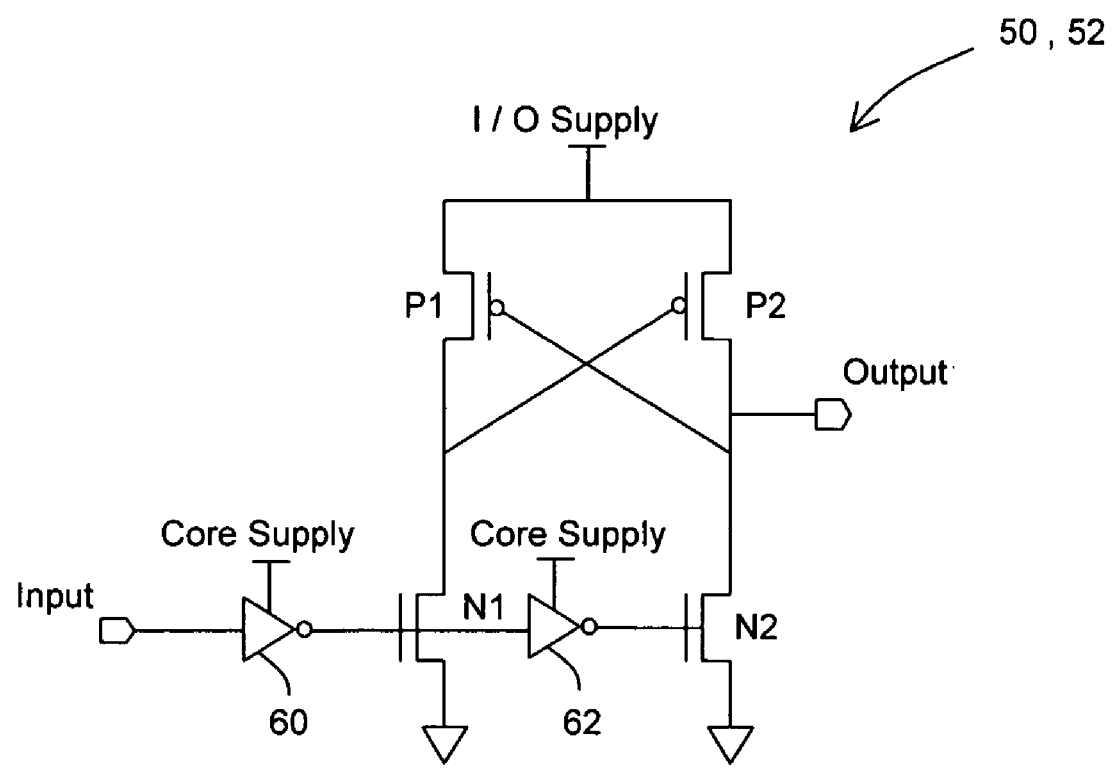
FIG. 5 is a detailed schematic diagram of a level shifter shown in FIG. 3, in accordance with one embodiment.

Referring to FIG. 5, a detailed schematic of the level shifters 50 and 52 in accordance with one embodiment is provided. A pair of PMOS transistors p1 and p2 may have their sources commonly coupled to an I/O power supply source. The gates of the transistors p1 and p2 may be cross-coupled to the drains of the transistors p2 and p1, respectively. The level shifters 50 and 52 also may include a pair on NMOS transistors n1 and n2 which have their drains coupled to the drains of the transistors p1 and p2, respectively, and their sources commonly coupled to ground. An Input terminal for receiving an input signal (Data2 or delayed Clock, as the case may be) may be coupled to a first inverter 60, which in turn may be coupled the gate of the transistor n1 and a second inverter 62. Both of the inverters 60 and 62 are powered by the core power supply source. The I/O power supply source and the core power supply source may have different voltages. An Output terminal, for providing the level shifted signals, may be coupled to the drains of the transistors p2 and n2 and the gate of transistor p1.

With respect to the claims, in the example of FIG. 5 where data signals are passing from the core supply domain to the I/O supply domain, the core power supply source is a first supply source generating a first supply voltage and the I/O power supply source is a second supply source generating a second supply voltage. In the case where the data signals are passing from the I/O supply domain to the core supply domain, the I/O power supply source is the first supply source generating the first supply voltage and the core power supply source is the second supply source generating the second supply voltage. The converter circuit in accordance with one embodiment of the invention is applicable to other types of circuits and is not limited to use with the core and I/O sections of the microprocessor. Signal edges or transitions of the data signals are referred to as "data edges" and signal edges or transitions of clock signals are referred to as "clock edges". Edges or transitions generally refer to the signal transitioning from one logic state (one voltage) to another logic state (another voltage).

Figure 6:
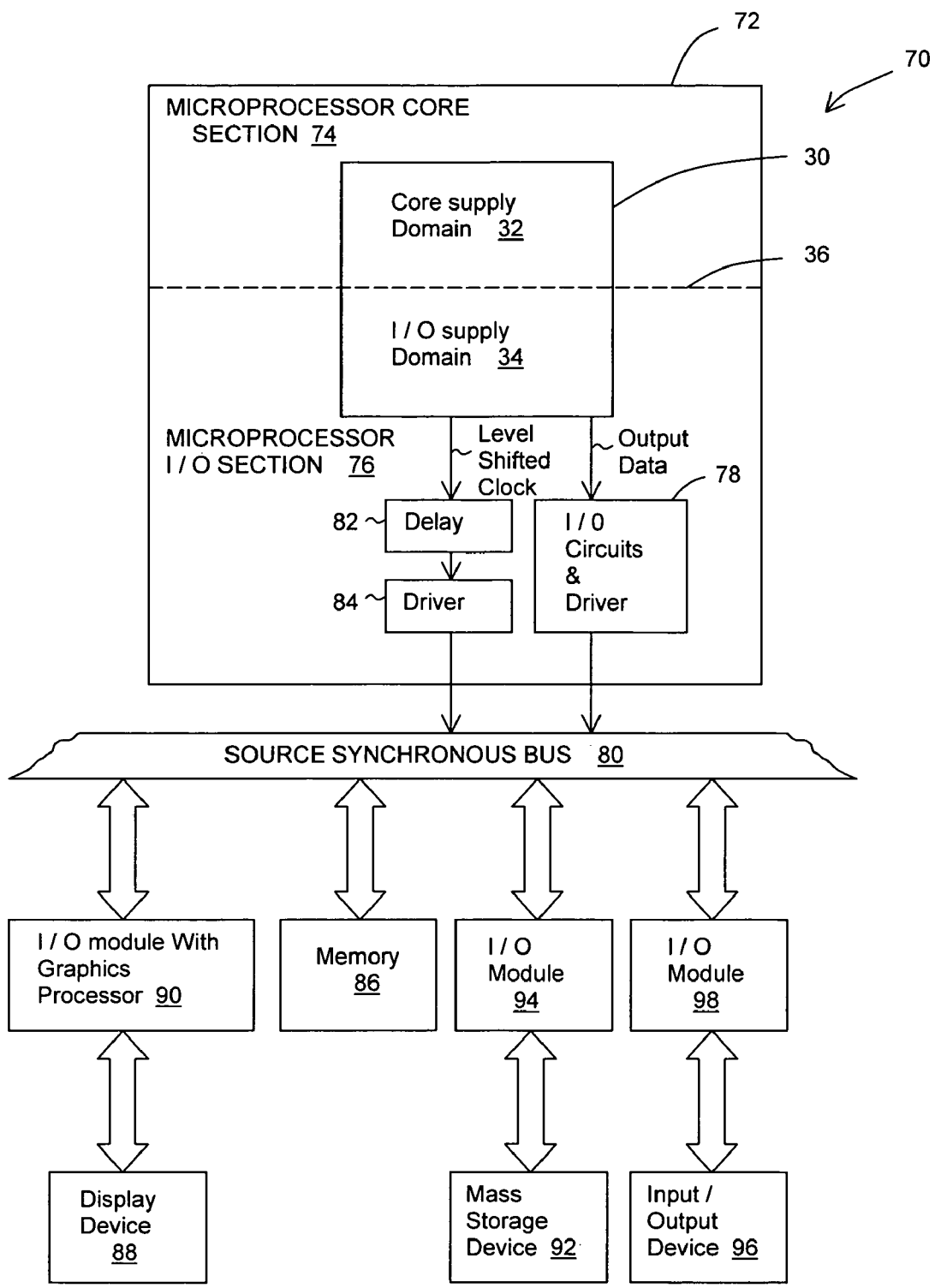
FIG. 6 is a block diagram of a system incorporating the converter circuit of FIG. 3, in accordance with one embodiment.

There are number of possible applications for the converter circuit 30 of FIG. 3 wherein the data path needs to traverse power supply domains, such as for source synchronous CPU-chipset bus applications or common clock applications. In FIG. 6 the circuit 30, according to one embodiment of the invention, is shown in a synchronous CPU-chipset bus application. In this application, the circuit 30 is used to decrease timing skew for source-synchronous data and strobe signals that cross circuit domains with different supply voltages. The output path from the microprocessor for the output data signal is a source-synchronous bus.

Referring to FIG. 6, components that are in common with FIG. 3 use the same reference numbers. A system 70 includes a microprocessor 72 contained in a microprocessor integrated circuit (IC). The microprocessor 72 includes a microprocessor core section 74 and a microprocessor I/O section 76. The microprocessor core section 74 includes the central processing unit (CPU). The two sections are divided by the dashed line 36, which also shows a division between the core supply domain 32 coupled to a first supply voltage (not shown) and the I/O supply domain 34 coupled to a second supply voltage (not shown). As in FIG. 3, the converter 30 traverses the dashed line 36 so as to provide a data pathway between the two supply domains 32 and 34. The Output Data signal generated by the converter circuit 30 is provided to additional I/O circuitry 78, which includes an output driver. The output driver is coupled to a source synchronous bus 80 to drive the Output Data signal over the bus 80.

The Level Shifted Clock signal is distributed as the source synchronous strobe signal over the bus 80. In the illustrative system of FIG. 6, the Level Shifted Clock signal may be delayed by a half clock cycle via a delay element 82. Thereafter, the delayed Level Shifted Clock signal is passed to a driver 84, which applies the delayed Level Shifted Clock signal to the bus 80. In this implementation, the strobe signal is sent out separately from the data signal and is delayed by the half clock cycle from the data signal so as to be centrally spaced between changes in the data signal. This centering assists a receiver in using the strobe to latch the data, i.e., to sample the data in the middle of the eye diagram. In an alternative implementation, the strobe signal may be sent with the data without a delay in timing so that they arrive simultaneously at the receiver. In this alternative implementation, the receiver may be relied upon to skew the data and strobe so that the receiver may use the strobe to latch the data at a time when the data is stable.

In addition to the microprocessor 72, a main memory 86 and a plurality of input/output (I/O) modules for external devices or external buses may be coupled to the bus 80. More specifically, the system 70 may include a display device 88 coupled to the bus 80 by way of an I/O module 90, with the I/O module 90 having a graphical processor and a memory. The system 70 may further include a mass storage device 92 coupled to the bus 80 via an I/O module 94. Another I/O device 96 may be coupled to the bus 80 via the I/O module 98. Additional I/O modules may be included for other external or peripheral devices or external buses. Examples of the memory 86 include, but are not limited to, static random access memory (SRAM) and dynamic random access memory (DRAM). Examples of the mass storage device 92 include, but are not limited to, a hard disk drive, a compact disk drive (CD), a digital versatile disk driver (DVD), a floppy diskette, a tape system and so forth. Examples of the input/output devices 96 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). Depending upon the external device, the internal interfaces of I/O modules may use programmed I/O, interrupt-driven I/O, or direct memory access (DMA) techniques for communications over the bus 80. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
a clock source to generate a clock signal;
a first circuit, coupled to a first supply voltage source, to generate a first data signal and a second circuit coupled to a second supply voltage source;
a flip-flop, having a pair of inputs coupled to the clock source and the first circuit, to generate a second data signal in response to the clock signal and the first data signal, with the flip-flop including a master latch and an upstream slave latch coupled to the master latch;
a first level shifter, coupled to the flip-flop, to generate a level shifted data signal in response to the second data signal;
a delay element coupled to the clock source and responsive to the clock signal to generate a delayed clock signal having a triggering clock edge and a non-triggering clock edge;
a downstream slave latch, having an open state and a close state, a pair of inputs coupled to the first level shifter and the delay element and an output coupled to the second circuit, to generate an output data signal in response to the level shifted data signal and the delayed clock signal, with the triggering clock edge of the delayed clock signal switching the downstream slave latch from the close state to the open state;
a second level shifter, coupled between the clock source and the downstream slave latch and in series with the delay element, and
wherein the level shifted data signal has a plurality of rising and falling data edges and the delay element is operable to delay an arrival of the triggering clock edge at the downstream slave latch until after an arrival of the rising and falling data edges at the downstream latch.

2. The apparatus according to claim 1, wherein the delayed clock signal has a plurality of clock cycles with each of the clock cycles having a rising clock edge and a falling clock edge; and the triggering clock edge is selected from the rising clock edge and the falling clock edge, with a non-selected one of the rising clock edge and the falling edge being the non-triggering clock edge.

3. The apparatus according to claim 1, wherein the delayed_clock signal has a plurality of clock cycles with each of the clock cycles having a rising clock edge and a falling clock edge; and the downstream slave latch is switched from the close state to the open state by the triggering clock edge selected from the rising clock edge and the falling clock edge and switched from the open state to the close state by the non-selected clock edge of the rising clock edge and the falling clock edge.

4. The apparatus according to claim 3, wherein the level shifted data signal has a plurality of rising and falling data edges and the delay element is operable to introduce a predetermined delay having a duration exceeding a time period during which the rising and falling data edges are mismatched.

5. The apparatus according to claim 3, wherein the master latch is coupled to the clock source and the upstream slave latch has a pair of inputs coupled to the master latch and the clock source and an output coupled to the first level shifter.

6. The apparatus according to claim 5, wherein the master latch has an input to receive the first data signal; and the flip-flop is operable to generate the second data signal in response to the first data signal.

7. An apparatus, comprising:
a microprocessor including a central processing unit (CPU) section having a first supply voltage source; an input-output (I/O) section having a second supply voltage source; a clock source to generate a clock signal; and a selected section of the CPU section and the I/O sections being operable to generate a first data signal, with the selected section providing a first data signal;
a converter circuit including a flip-flop, coupled to the clock source and the selected section, to generate a second data signal in response to the clock signal and the first data signal, with the flip-flop including a master latch and an upstream slave latch coupled to the master latch; a first level shifter, coupled to the selected section, to generate a level shifted data signal in response to the second data signal; a delay element and a second level shifter, coupled in series to the clock source, to generate a level shifted clock signal with a triggering clock edge and a non-triggering clock edge in response to the clock signal; a downstream slave latch having an open and a close state, a pair of inputs coupled to the first level shifter and the series-coupled delay element and second level shifter, and an output coupled to the non-selected section of the CPU and I/O sections; the downstream slave latch adapted to generate an output data signal in response to the level shifted data signal and the triggering clock edge of the level shifted clock signal; and
wherein the level shifted data signal has a plurality of rising and falling data edges and the delay element is operable to delay an arrival of the triggering clock edge at the downstream slave latch until after an arrival of the rising and falling data edges at the downstream slave latch.

8. The apparatus according to claim 7, wherein the level shifted clock signal has a plurality of clock cycles with each of the clock cycles having a rising clock edge and a falling clock edge; the downstream slave latch has an open and a close state; and the downstream slave latch is switched from the close state to the open state by the triggering clock edge selected from the rising clock edge and the falling clock edge, with a non-selected one of the rising clock edge and the falling edge being the non-triggering clock edge.

9. The apparatus according to claim 8, wherein the master latch is coupled to the clock source and the upstream slave latch has a pair of inputs coupled to the master latch and the clock source and an output coupled to the first level shifter.

10. The apparatus according to claim 9, wherein the master latch has an input to receive the first data signal; and the flip-flop is operable to generate the second data signal in response to the first data signal.

11. A system, comprising:
a microprocessor including a central processing unit (CPU) section coupled to a first supply voltage source; an input-output (I/O) section coupled to a second supply voltage source; a clock source to generate a clock signal; and the CPU section being operable to generate a first data signal;

a converter circuit including a flip-flop, coupled to the clock source and the selected section, to generate a second data signal in response to the clock signal and the first data signal, with the flip-flop including a master latch and an upstream slave latch coupled to the master latch; a first level shifter, coupled to the CPU section, to generate a level shifted data signal in response to the second data signal; a delay element and a second level shifter, coupled in series to the clock source, to generate a level shifted clock signal having a triggering clock edge and a non-triggering clock edge in response to the clock signal; and a downstream slave latch having an open and a close state, a pair of inputs coupled to the first and second level shifters and an output coupled to the I/O section; the downstream slave latch being adapted to generate an output data signal in response to the level shifted data signal and the triggering clock edge of the level shifted clock signal;

a source synchronous bus, coupled to the I/O section, to receive the level shifted data signal and the level shifted clock signal;

an I/O module coupled to the source synchronous bus; and wherein the level shifted data signal has a plurality of rising and falling data edges and the delay element is operable to delay an arrival of the triggering clock edge until after an arrival of the rising and falling data edges at the downstream slave latch.

12. The system according to claim 11, wherein the I/O module is a selected one of a graphics and a video controller.

13. The system according to claim 11, wherein the level shifted clock signal has a plurality of clock cycles with each of the clock cycles having a rising clock edge and a falling clock edge; the downstream slave latch has an open and a close state; and the downstream slave latch is switched from the close state to open state by the triggering clock edge selected from the rising clock edge and the falling clock edge, with a non-selected one of the rising clock edge and the falling edge being the non-triggering clock edge.

14. The system according to claim 13, wherein the master latch is coupled to the clock source and the upstream slave latch has a pair of inputs coupled to the master latch and the clock source and an output coupled to the first level shifter.

15. The system according to claim 14, wherein the master latch has an input to receive the first data signal; and the flip-flop is operable to generate the second data signal in response to the first data signal.

16. A converter circuit, comprising a flip-flop including a master latch and an upstream slave latch, to generate a latched data signal in response to a clock signal and an input data signal; the flip-flop including a master latch and an upstream slave latch coupled to the master latch;

a first level shifter, coupled to the flip-flop, to generate a level shifted data signal in response to the latch data signal, with the level shifted data signal having a plurality of signal transitions;

a delay element to generate a delayed clock signal having a triggering clock edge and a non-triggering edge in response to the clock signal;

a second level shifter, coupled in series with the delay element, to voltage level shift the delayed clock signal;

a downstream slave latch having an open and a close state, coupled to the first level shifter and the delay element, to generate an output data signal in response to the level shifted data signal and the triggering clock edge; and wherein the delay element is adapted to delay an arrival of the triggering clock edge at the downstream slave latch until after an arrival of the signal transitions at the downstream slave latch.

17. The converter circuit according to claim 16, wherein the delayed clock signal has a plurality of clock cycles with each of the clock cycles having a rising clock edge and a falling clock edge; and the downstream slave latch is switched from the close state to open state by the triggering clock edge, with the triggering clock edge being selected from the rising clock edge and the falling clock edge and a non-selected one of the rising clock edge and the falling edge being the non-triggering clock edge.

18. The converter circuit, according to claim 16, wherein the delay element is adapted to introduce a predetermined delay having a duration exceeding a time period during which the rising and falling data edges are mismatched.

* * * * *